(12) United States Patent
Kasper et al.

(10) Patent No.: US 11,081,436 B2
(45) Date of Patent: Aug. 3, 2021

(54) COMPONENT CARRIER WITH INTEGRATED STRAIN GAUGE

(71) Applicant: AT&S Austria Technologie & Systemtechnik Aktiengesellschaft, Leoben (AT)

(72) Inventors: Alexander Kasper, Graz (AT); Thomas Krivec, Zeltweg (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 220 days.

(21) Appl. No.: 16/084,987

(22) PCT Filed: Mar. 15, 2017

(86) PCT No.: PCT/EP2017/056130
§ 371 (c)(1),
(2) Date: Sep. 14, 2018

(87) PCT Pub. No.: WO2017/158028
PCT Pub. Date: Sep. 21, 2017

(65) Prior Publication Data
US 2019/0074245 A1  Mar. 7, 2019

(30) Foreign Application Priority Data
Mar. 15, 2016  (EP) .................... 16160494

(51) Int. Cl.
*H01L 23/498* (2006.01)
*H01K 1/16* (2006.01)
(Continued)

(52) U.S. Cl.
CPC .......... *H01L 23/49822* (2013.01); *G01L 1/22* (2013.01); *H05K 1/16* (2013.01);
(Continued)

(58) Field of Classification Search
CPC .... G01L 1/22–225; H05K 1/167; H05K 3/12; H05K 2201/10151; H05K 2201/10196
See application file for complete search history.

(56) References Cited

U.S. PATENT DOCUMENTS 2,318,102 A   5/1943  Ruge
7,094,061 B1  8/2006  Kieffer et al.
(Continued)

FOREIGN PATENT DOCUMENTS

CN   1930929 A     3/2007
CN   103662083 A   3/2014
(Continued)

OTHER PUBLICATIONS

Office Action in Application No. 201780017176.X; pp. 1-12; May 24, 2021; China National Intellectual Property Administration; No. 6, Xitucheng Lu, Jimenqiao Haidian District, Beijing City; 100088, China.

(Continued)

*Primary Examiner* — Hoa C Nguyen
(74) *Attorney, Agent, or Firm* — Robert A. Blaha; Smith Tempel Blaha LLC

(57) ABSTRACT

A component carrier for carrying an electronic component on and/or in the component carrier, wherein the component carrier includes an interconnected stack composed of a plurality of electrically conductive layer structures and a plurality of electrically insulating layer structures, wherein at least part of at least one of the electrically conductive layer structures is configured as at least part of an integrated strain gauge configured for detecting strain exerted on at least part of the component carrier.

3 Claims, 5 Drawing Sheets

(51) Int. Cl.
*G01L 1/22* (2006.01)
*H05K 1/16* (2006.01)
*H05K 3/12* (2006.01)
*H05K 3/42* (2006.01)
*H05K 3/46* (2006.01)

(52) U.S. Cl.
CPC .............. *H05K 3/12* (2013.01); *H05K 3/421* (2013.01); *H05K 3/4611* (2013.01); *H05K 2201/09263* (2013.01); *H05K 2201/10151* (2013.01)

(56) References Cited

U.S. PATENT DOCUMENTS

| | | | |
|---|---|---|---|
| 2005/0120807 A1 | 6/2005 | Wingett et al. | |
| 2005/0252311 A1 | 11/2005 | Ong et al. | |
| 2007/0068218 A1 | 3/2007 | Pecher et al. | |
| 2007/0190846 A1* | 8/2007 | Yamashita | H05K 1/0271 439/465 |
| 2010/0327441 A1 | 12/2010 | Suehiro | |
| 2012/0291564 A1* | 11/2012 | Amos | A43B 3/0005 73/862.045 |
| 2015/0135857 A1* | 5/2015 | Kawamura | G01L 1/225 73/862.045 |
| 2015/0296607 A1* | 10/2015 | Yang | G01L 1/205 361/750 |
| 2016/0050750 A1* | 2/2016 | Rogers | H05K 1/0275 361/767 |
| 2017/0030784 A1* | 2/2017 | Mason | G01M 5/0083 |

FOREIGN PATENT DOCUMENTS

| | | |
|---|---|---|
| CN | 105273187 A | 1/2016 |
| DE | 102006059392 A1 | 6/2008 |
| EP | 1708554 A1 | 10/2006 |
| JP | H08-25385 A | 1/1996 |
| JP | 2000340916 A | 12/2000 |
| JP | 2001015882 A | 1/2001 |
| JP | 2011119403 A | 6/2011 |
| TW | 200801468 A | 1/2008 |
| WO | WO 96/38025 A1 | 11/1996 |
| WO | 2015138515 A1 | 9/2015 |

OTHER PUBLICATIONS

English translation of cover of Office Action in Application No. 201780017176.X; pp. 1-3; May 24, 2021; China National Intellectual Property Administration; No. 6, Xitucheng Lu, Jimenqiao Haidian District, Beijing City; 100088, China.

* cited by examiner

COMPONENT CARRIER WITH INTEGRATED STRAIN GAUGE

TECHNICAL FIELD

The invention relates to a component carrier, a method of manufacturing a component carrier, and a method of use.

TECHNOLOGICAL BACKGROUND

Along with the development of electronic industries, electronic products have a trend towards miniaturization and high performance, and accordingly multi-layer boards are developed so as to increase the layout area for the layout through interlayer connection techniques, and meet demands for high-density integrated circuits and meanwhile reduce the thickness of packaging substrates. In modern applications of component carrier technology, sophisticated electronic functionality may be implemented.

Although existing methods of manufacturing component carriers are powerful, there is still room for improvement in terms of simplifying the manufacturing process and providing additional functionality.

SUMMARY

There may be a need to provide a component carrier with increased functionality.

A component carrier, a method of manufacturing a component carrier, and a method of use according to the independent claims are provided.

According to an exemplary embodiment of the invention, a component carrier for carrying an electronic component on and/or in the component carrier is provided, wherein the component carrier comprises an interconnected stack composed of a plurality of electrically conductive layer structures and a plurality of electrically insulating layer structures, wherein at least part of at least one of the electrically conductive layer structures is configured as at least part of an integrated strain gauge configured for detecting strain exerted on at least part of the component carrier.

According to another exemplary embodiment of the invention, a method of manufacturing a component carrier is provided, wherein the method comprises forming an interconnected stack of a plurality of electrically conductive layer structures and a plurality of electrically insulating layer structures, and configuring at least one of the electrically conductive layer structures as an integrated strain gauge configured for detecting strain exerted on the component carrier.

According to still another exemplary embodiment of the invention, an electrically conductive structure of a printed circuit board (PCB) is used as at least part of a strain gauge.

OVERVIEW OF EMBODIMENTS

In the context of the present application, the term "component carrier" may particularly denote a physical structure which is configured for surface mounting on and/or embedding in, as well as for electrically contacting, at least one electronic component, such as an electronic chip. Thus, after a surface mounting or embedding procedure, the component carrier carries the one or more electronic components on an exterior surface or in an interior thereof.

In the context of the present application, the term "layer structure" may particularly denote a complete layer (such as a copper sheet), a patterned layer (such as a patterned copper foil, a sheet of resin, like epoxy resin, and fibers, like glass fibers, with through holes therein) or a plurality of separate structural elements arranged in the same plane (such as a plurality of vertical through connections, in particular vias which may be copper vias, extending through hollow spaces in a patterned layer, for instance in patterned layers of prepreg or FR4).

According to an exemplary embodiment of the invention, a component carrier is provided with a strain gauge being integrally formed as a part of an interconnected layer stack rather than attaching a separate strain gauge member to a component carrier. This allows to provide a strain gauge function in a component carrier with low manufacturing effort, in a compact way and with a high detection accuracy as a result of the integral formation of strain gauge and component carrier (the latter serving as object under investigation in terms of determining strain). Undesired delamination of strain gauge and layer stack may be prevented so that the component carrier is also robust during operation. Furthermore, by integrating a strain gauge in a component carrier such as a PCB (printed circuit board), the sensitivity of detecting a specific strain acting on the component carrier or a part thereof using the integrated strain gauge can be increased since the strain can be measured specifically at a position of interest where the strain occurs. Furthermore, a strain gauge integrally formed with a component carrier may simply be located in a compact and flexible way in any non-used portion of a component carrier, and with a high flexibility of individually detecting strain in specific sections of the component carrier. A major advantage of an integrated strain gauge according to an exemplary embodiment of the invention is that it can be individually adjusted (in particular in terms of position, shape and dimension) to a certain strain detection task on and/or in the component carrier. Moreover, externally attaching a separate strain gauge member on a PCB in a conventional approach may involve an additional material which may deteriorate the accuracy of the measurement. In contrast to this, an exemplary embodiment of the invention may implement an integrated strain gauge which may be provided without adding further materials different from PCB materials.

In the following, further exemplary embodiments of the component carrier and the methods will be explained.

In an embodiment, the strain gauge comprises at least one of a meandrous electrically conductive path and an electrically conductive path circumfering a region of interest, wherein the electrically conductive path is formed by at least one of the electrically conductive layer structures.

In an embodiment, the strain gauge comprises at least one pad formed by at least one of the electrically conductive layer structures and configured to be electrically coupled to a strain determination circuit.

In an embodiment, the strain gauge is configured to change its electric resistance in the event of strain exerted to the component carrier.

In an embodiment, the strain gauge is formed partially or entirely on a surface of the component carrier.

In an embodiment, the strain gauge is embedded partially or entirely within an interior of the component carrier.

In an embodiment, the component carrier comprises a strain determination circuit electrically connected to the strain gauge and configured for determining strain based on a signal supplied from the strain gauge in the event of strain. Alternatively, a strain determination circuit may be provided separately from the component carrier and may be electrically connected with the strain gauge via a connection structure on an exterior of the component carrier.

In an embodiment, the strain determination circuit is surface-mounted on and/or embedded within the interconnected stack and is electrically connected with the strain gauge.

In an embodiment, the strain determination circuit comprises or consists of a Wheatstone bridge.

In an embodiment, the strain gauge is located on top of one of the electrically insulating layer structures.

In an embodiment, the strain gauge comprises at least one vertical interconnect, forming part of at least one of the electrically conductive layer structures, configured for electrically connecting the strain gauge to a surface of the component carrier and/or to a strain determination circuit.

In an embodiment, at least one of the electrically conductive layer structures and/or at least one of the electrically insulating layer structures is made of a flexible or an elastic material.

In an embodiment, at least a strain sensitive portion of the strain gauge has a vertically thickness in a range between 0.5 μm and 18 μm, in particular in a range between 1 μm and 5 μm, more particularly between 2 μm and 3 μm. Such thin structures show a high change of the ohmic resistance under the influence of strain and therefore promote a high accuracy of the strain detection.

In an embodiment, at least a strain sensitive portion of the strain gauge is configured as a sponge-like structure. A structure with such a consistency, which can be manufactured by printing conductive ink or paste, shows a high change of the ohmic resistance under the influence of strain and therefore promotes a high accuracy of the strain detection.

In an embodiment, the strain gauge is arranged to at least partially surround a structure for which a strain behavior is under investigation, in particular a pad.

In an embodiment, at least a strain sensitive portion of the strain gauge is configured as a planar structure located exclusively within one plane.

In an embodiment, the strain gauge comprises a plurality of separate sections each of which being configured for locally detecting strain exerted on a corresponding portion of the component carrier at which the respective section is located. Such an embodiment may allow to determine a stress landscape in a spatially resolved manner.

In an embodiment, the interconnected stack is a laminated stack, i.e. is interconnected by mechanical pressure and/or heat.

In an embodiment, the integrated strain gauge is formed at least partially by printing an electrically conductive ink or paste, in particular by screen printing or ink-jet printing or by aerosol-based printing. As a result of such a manufacturing procedure, a very thin and sponge-like electrically conductive strain gauge structure can be obtained which shows a pronounced modification of its ohmic resistance in the presence of already small strain, and therefore a high detection accuracy. In other words, an integrated strain gauge manufactured by printing may generate a strong signal even in the presence of small strain. With such a strain gauge, a large change of the value of the electric resistance for a certain amount of strain is obtained.

In an embodiment, the integrated strain gauge is formed at least partially by laminating and patterning an electrically conductive layer. Thus, formation of the strain gauge may be fully integrated in the lamination procedure of PCB technology. If desired, the thickness of a patterned electrically conductive layer of a laminated stack may be selectively thinned in a portion in which the patterned electrically conductive layer shall be used as integrated strain gauge (for instance by differential etching). A remaining portion of such a patterned electrically conductive layer which may be used for another purpose within the framework of the PCB functionality, may remain thicker.

In an embodiment, the integrated strain gauge is formed at least partially by sputtering electrically conductive material.

In an embodiment, at least one of the electrically insulating layer structures comprises at least one of the group consisting of resin (such as reinforced or non-reinforced resins, for instance epoxy resin), in particular Bismaleimide-Triazine resin, cyanate ester, epoxy resin, glass (in particular glass fibers, multi-layer glass or glass-like materials), polyimide, polyamide, polyphenylenether (PPO), liquid crystal polymer, epoxy-based Build-Up Film, FR4 material, FR5 material, polytetrafluoroethylene (Teflon), a ceramic, and a metal oxide. Although epoxy resin or FR4 are usually preferred, other materials may be used as well.

In an embodiment, at least one of the electrically conductive layer structures comprises at least one of the group consisting of copper, aluminum, nickel, platinum, and an alloy, in particular a copper-nickel alloy, constantan (i.e. a copper-nickel-manganese alloy), Nichrome V, Chromol C, and/or platinum-tungsten. Although copper is usually preferred, other materials are possible as well.

In an embodiment, the component carrier is shaped as a plate. The component carrier may hence be shaped like a sheet and may be for instance embodied as a laminate type component carrier.

In an embodiment, the component carrier is configured as one of the group consisting of a printed circuit board, and a substrate.

In the context of the present application, the term "printed circuit board" (PCB) may particularly denote a plate-shaped component carrier which is formed by laminating several electrically conductive layer structures with several electrically insulating layer structures, for instance by applying pressure, if desired accompanied by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more electronic components which may be embedded in a printed circuit board, a printed circuit board is usually configured for accommodating one or more electronic components on one or both opposing surfaces of the plate-shaped printed circuit board. They may be connected to the respective main surface by soldering.

In the context of the present application, the term "substrate" may particularly denote a small component carrier having substantially the same size as an electronic component to be mounted thereon.

In an embodiment, the component carrier is a laminate-type component carrier. In such an embodiment, the component carrier is a compound of multiple layer structures which are stacked and connected together by applying a pressing force, if desired accompanied by heat. Thus, the component carrier may be formed by stacking a plurality of layer structures and connecting them by the application of mechanical pressure and thermal energy (i.e. heat).

The aspects defined above and further aspects of the invention are apparent from the examples of embodiment to be described hereinafter and are explained with reference to these examples of embodiment.

BRIEF DESCRIPTION OF THE DRAWINGS

The invention will be described in more detail hereinafter with reference to examples of embodiment but to which the invention is not limited.

DETAILED DESCRIPTION OF ILLUSTRATED EMBODIMENTS

Figure 1:
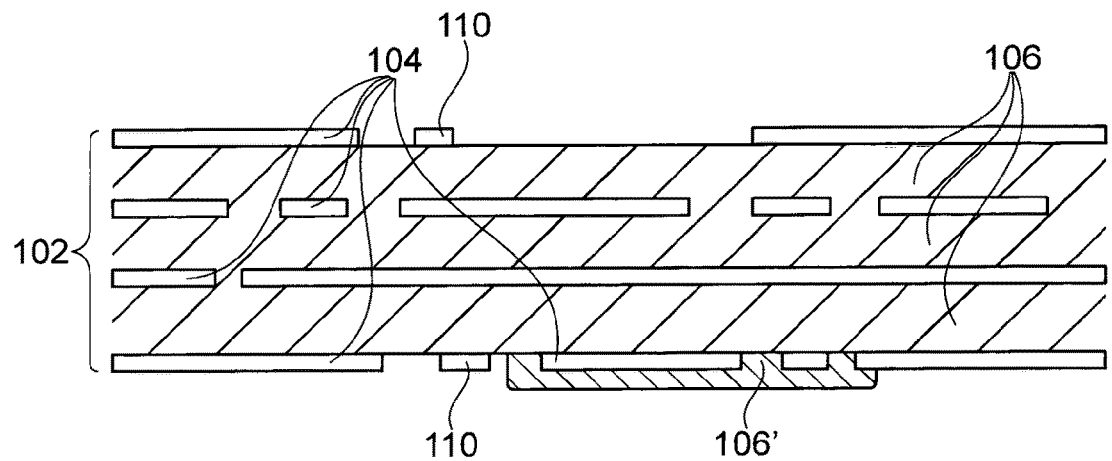
FIG. 1, FIG. 2, FIG. 3, FIG. 4, FIG. 5 and FIG. 6 show cross-sectional views of structures obtained during carrying out a method of manufacturing a component carrier with integrated strain gauge according to an exemplary embodiment of the invention.

The illustrations in the drawings are schematically presented. In different drawings, similar or identical elements are provided with the same reference signs.

Before, referring to the drawings, exemplary embodiments will be described in further detail, some basic considerations will be summarized based on which exemplary embodiments of the invention have been developed.

Exemplary embodiments of the invention provide printed embedded strain gauges.

Strain gauges are widely used to measure for instance the mechanical performance of objects. Standard strain gauges are manufactured on foils mostly employing CVD/PVC etc. methods. The strain gauge itself is a meander shaped conductor. When now the foil with the meander structures are glued onto an object, for instance a PCB, and this PCB is then bent or stretched, the meander structure is also stretched and hence the resistance will change. This change in resistance can be measured using a bridge detection circuit. Such strain gauges are available in different dimensions and forms and fulfil certain standardized resistance values. However, conventional strain gauge members being simply attached to a PCB tend to detachment. Even if then remain attached, the accuracy of the measurement is limited because PCB strain not necessarily translates 1 to 1 to strain detected by the attached strain gauge member.

According to an exemplary embodiment of the invention, a strain gauge is integrated within a component carrier such as a PCB, in particular may be made partially or completely of PCB material or PCBs like materials. In particular, such a strain gauge may form an integral part of the component carrier. According to an embodiment, a meander like structure or the like may be printed which allows a much higher flexibility in the design geometry. In addition, these structures can be located on inner layers of the component carrier and hence may be embedded in a protected way basically on an inner layer (wherein embodiments of the invention are not limited to embedded strain gauges). To form such a strain gauge, electrically conductive material may be printed as a meander like structure. Such a structure may be connected to pads which later on may allow to contact the structure via, for example, laser vias or plated through holes. It is also possible to print one or more pads. In order to be completely free in design, under the meander structure a dielectric layer can be placed which hence allows overprinting copper tracks.

Advantages of exemplary embodiments of the invention are:

Each card can be individualized

No pick and place of already made strain gauges is necessary

Complex and individual forms of strain gauges are possible (see drawing)

Interfacial stress can be measured

The following advantageous exemplary embodiments of the invention are possible:

Printed strain gauge on inner layers of the component carrier

Figure 8:
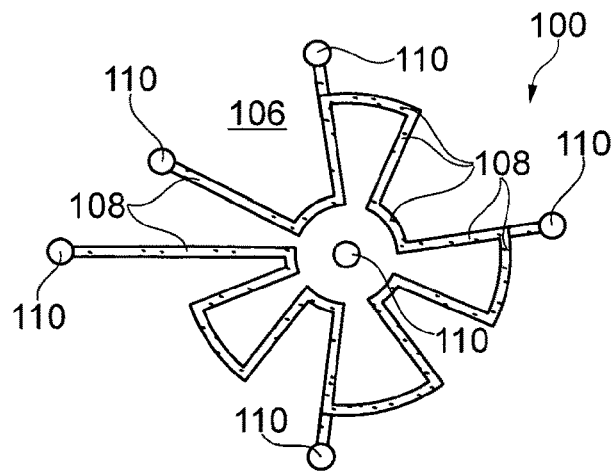

Printed dielectric layer underneath to isolate strain gauge from conducting tracks Protective dielectric Individual shapes are possible (see for instance FIG. 8)

On the same layer (or another layer) as strain gauge, one or more embedded components can be installed for data processing (of the strain gauge and/or for other purposes)

One or more of the following techniques may be carried out for manufacturing a component carrier with integrated strain gauge according to an exemplary embodiment of the invention:

Print technologies, which may be applied, are: screen printing, inkjet, aerosol, damp-on, etc. Also possible is to use a shadow mask and to use sputtering, CVD, etc.

Usable conductors are: Ag, Cu, Ni, Au, Ti, alloys (see also the above-mentioned list) and other conductors which can withstand a relamination process (see FIG. 4)

Usable dielectrics are: acrylate based or epoxy based materials and materials comparable in chemical and physical properties to FR4

Figure 4:
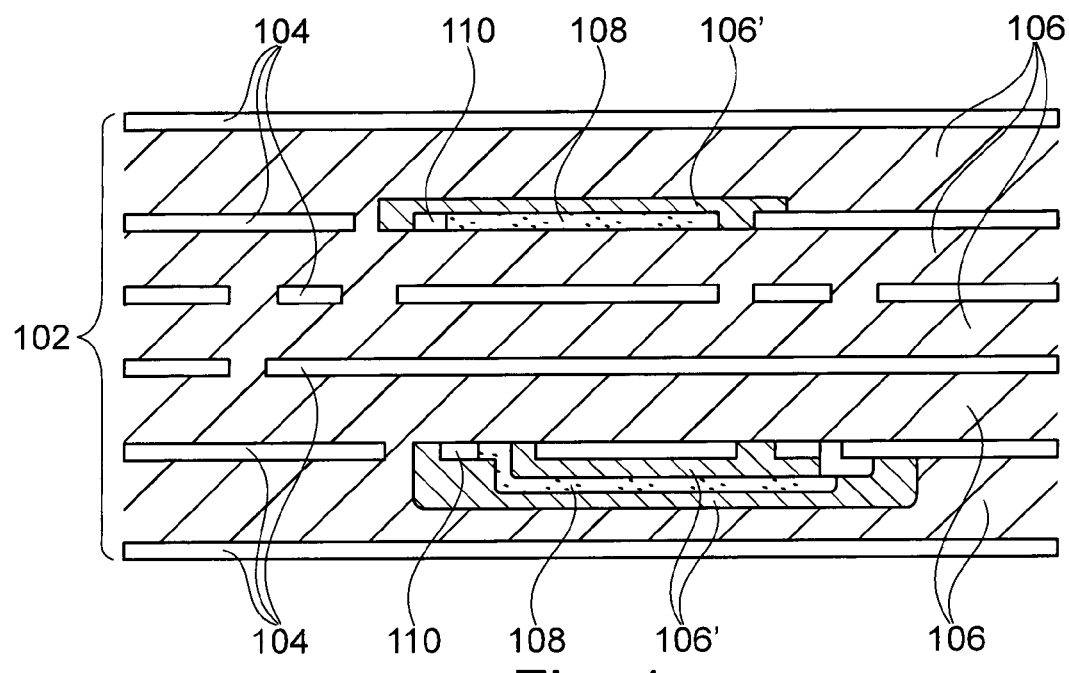
Figure 5:
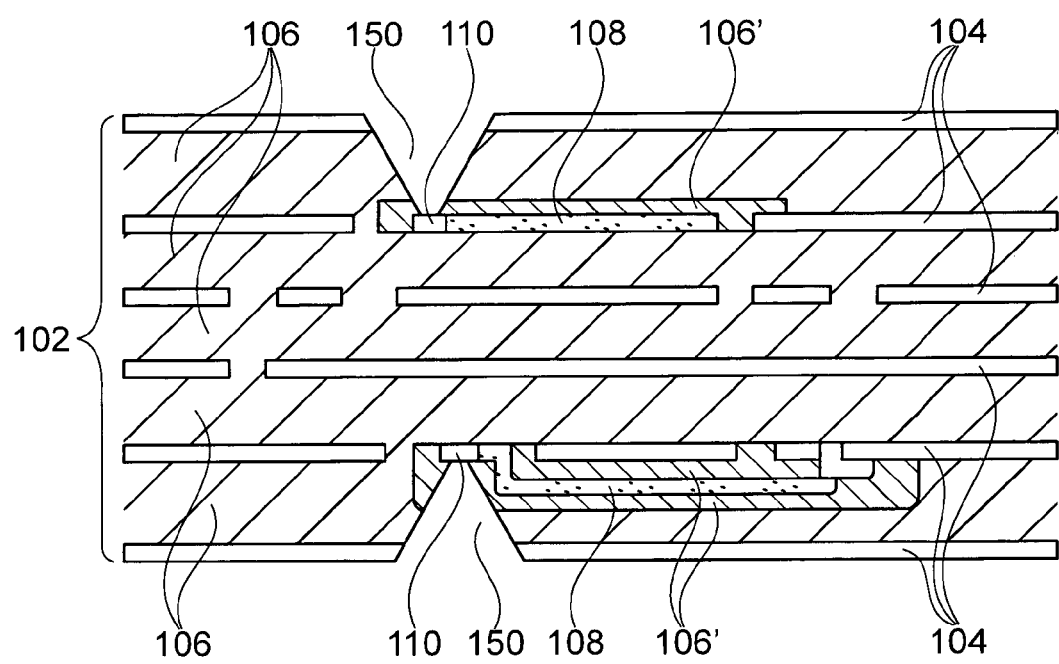
Figure 6:
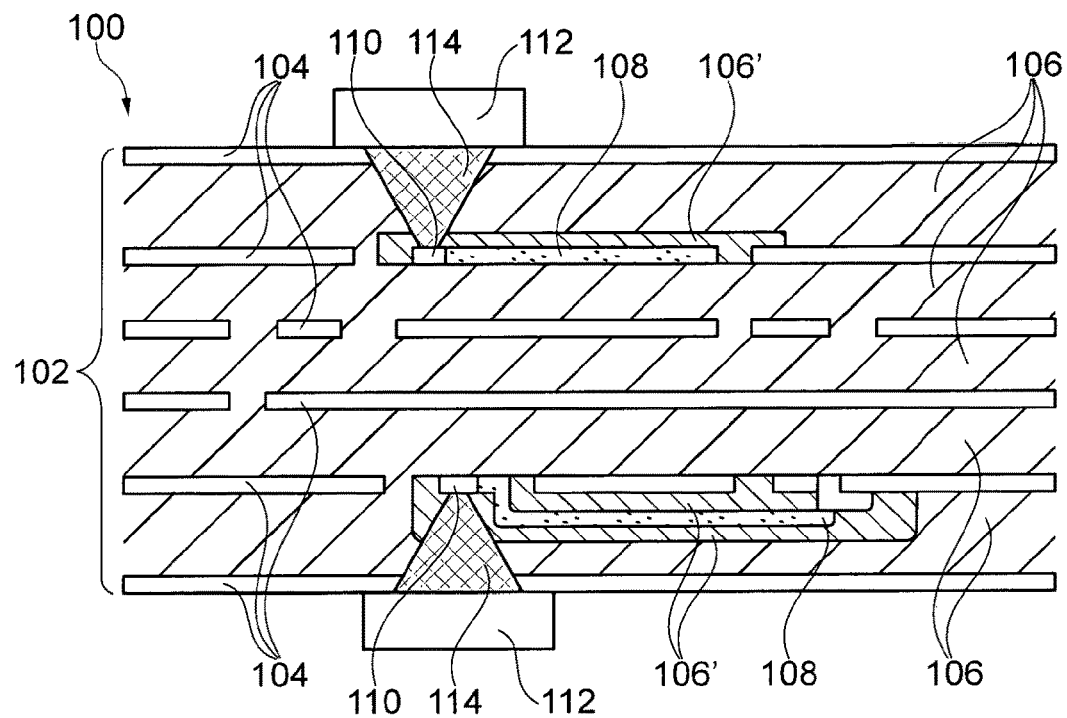

Thickness of a conductor used as strain gauge may be in a range from 0.5 µm to 18 µm, in particular 1 µm to 15 µm, preferably 2 µm to 3 µm Thickness of dielectric (see reference numeral 106'): same as conductor, should preferably ensure good edge coverage when printed over conducting edge FIG. 1 to FIG. 6 shows cross-sectional views of structures obtained during carrying out a method of manufacturing a component carrier 100 with integrated strain gauge 102 (as shown in FIG. 6) according to an exemplary embodiment of the invention.

A process flow of a method of manufacturing a component carrier 100 with integrated strain gauge 102 may be for example as follows:

FIG. 1: Print of dielectric material over copper of a laminate. An additional electrically insulating layer structure 106' may be applied (for instance printed) to a position of the shown laminated stack 102 of electrically conductive layer structures 104 and electrically insulating layer structures 106 where the integrated strain gauge 102 is to be formed subsequently (see FIG. 2). The additional electrically insulating layer structure 106' may alternatively also be one of the already present electrically insulating layer structures 106 and may allow to form an integrated strain gauge 108 also in the direct neighbourship of an electrically conductive layer structure 104, but electrically isolated therefrom to prevent undesired short-circuiting.

Figure 2:
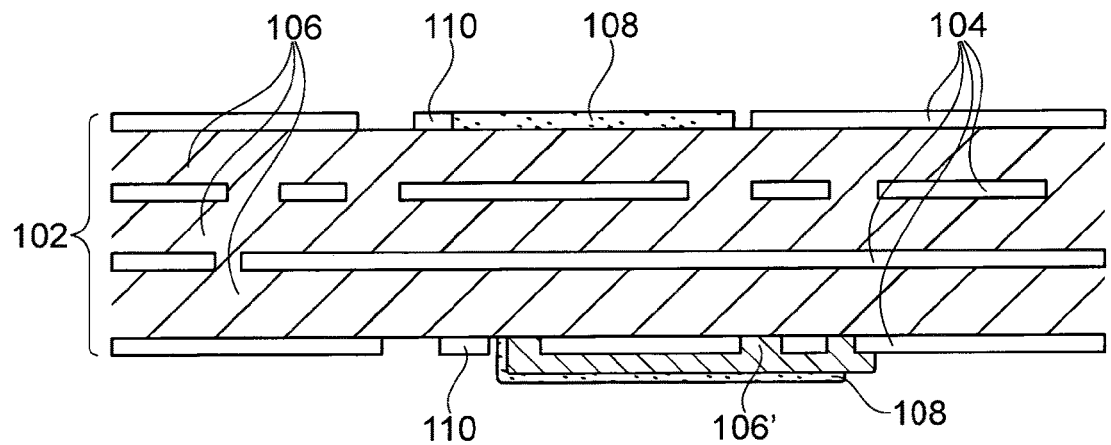

FIG. 2: Print conductor. The shown embodiment forms two strain gauges 108, whereas formation of only one or at least three strain gauges 108 is possible as well. According to FIG. 2, a first strain gauge 108 is printed directly on an exposed surface of one of the laminated electrically insulating layer structures 106. A second strain gauge 108 is printed directly on an exposed surface of the additional electrically insulating layer structure 106'. Both strain gauges 108 are electrically coupled to a respective pad 110, formed as part of a respective one of the electrically conductive layer structures 104.

Figure 3:
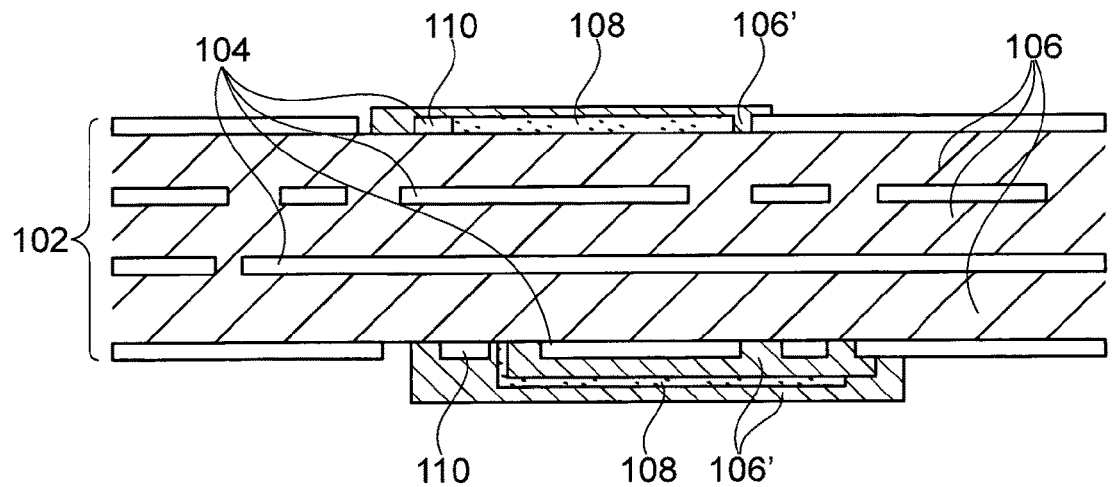

FIG. 3: Print dielectric (protective layer). As shown in FIG. 3, the copper ink forming the strain gauges 108 may be covered by an optional additional electrically insulating layer structure 106' for passivation.

FIG. 4: Relaminate. One or more further electrically conductive layer structures 104 and/or one or more further electrically insulating layer structures 106 may be laminated (preferably symmetrically) on both opposing main surfaces of the laminated layer stack 102 shown in FIG. 3 with the passivated strain gauges 108 thereon.

FIG. 5: Laser drill (or mechanical drill). By drilling, blind holes 150 may be formed to expose the pads 110 in direct contact with the strain gauges 108. Although not shown, via plated through holes are also possible.

FIG. 6: Copper fill. The blind holes 150 may be filled with copper material or the like to thereby form electrically conductive vertical interconnects 114 by a copper plating process. Furthermore, a strain detection circuit 112 may be surface mounted on the respective vertical interconnect 114 (and may hence form one of at least one electronic component which may be mounted on the component carrier 100). Alternatively, it is also possible to embed the strain detection circuit 112 (and/or any other electronic component) in an interior of the laminated stack 102 (not shown).

Thus, FIG. 1 to FIG. 6 show a method of manufacturing a component carrier 100 for carrying an electronic component on and/or in the component carrier 100, wherein the method comprises forming an interconnected stack 102 of a plurality of electrically conductive layer structures 104 and a plurality of electrically insulating layer structures 106, 106', and configuring part of the electrically conductive layer structures 104 as integrated strain gauges 108 for detecting strain exerted on the component carrier 100, wherein the integrated strain gauges 108 are formed by printing an electrically conductive ink or paste, in particular by screen printing or inkjet printing.

Alternatively, the integrated strain gauges 108 may be formed by laminating and patterning, if desired also back etching, an electrically conductive layer 104 or by sputtering electrically conductive material (not shown).

FIG. 6 shows a cross-sectional view of strain gauges 108 embedded in component carrier 100 according to an exemplary embodiment of the invention.

The component carrier 100 according to FIG. 6 is configured for carrying an electronic component on and/or in the component carrier 100, wherein the component carrier 100 comprises an interconnected stack 102 composed of a plurality of electrically conductive layer structures 104 and a plurality of electrically insulating layer structures 106, 106', wherein part of the electrically conductive layer structures 104 is configured as integrated strain gauges 108 configured for detecting strain exerted on at least part of the component carrier 100.

The strain gauges 108 comprise a respective pad 110 formed by a respective one of the electrically conductive layer structures 104 and configured to be electrically coupled to a respective strain determination circuit 112. The strain gauges 108 are configured to change the value of the resistance in the event of strain exerted to a respective section of the component carrier 100. The strain gauges 108 are embedded within an interior of the component carrier 100. The component carrier 100 comprises strain determination circuits 112 each electrically connected to a respective one of the strain gauges 108 and configured for determining strain based on a signal supplied from the respective strain gauge 108 in the event of strain. The strain determination circuits 112 are surface-mounted (or can be embedded within the interconnected stack 102) and are electrically connected with the respective strain gauge 108. The strain determination circuits 112 may comprise a Wheatstone bridge. The strain gauges 108 comprise a respective vertical interconnect 114 electrically connecting a strain sensitive portion of the respective strain gauge 108 to a surface of the component carrier 100 and to a respective one of the strain determination circuits 112. The strain gauges 108 have a vertically thickness in a range between 2 μm and 3 μm.

The interconnected stack 102 is a laminated stack 102. The electrically conductive layer structures 104 consist of copper. The electrically insulating layer structures 106 comprise cured prepreg material and may hence be of FR4 material. The additional electrically insulating layer structures 106' may be made of prepreg material, polyimide, resin, etc. The component carrier 100 is shaped as a plate and is configured as printed circuit board (PBC).

Figure 7:
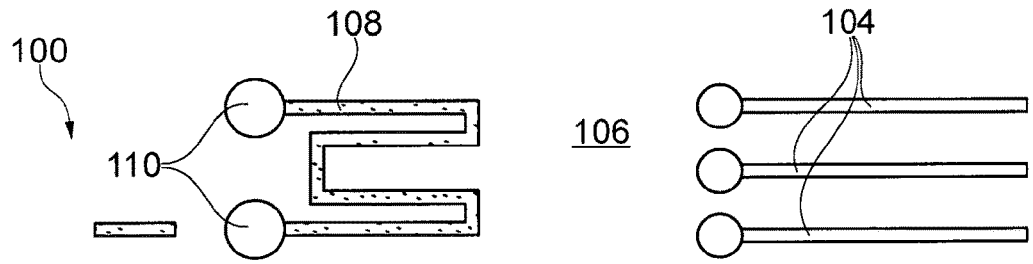
FIG. 7 and FIG. 8 show plan views of strain gauges embedded in a component carrier according to exemplary embodiments of the invention.

FIG. 7 and FIG. 8 show plan views of strain gauges 108 embedded in a component carrier 100 according to exemplary embodiments of the invention. FIG. 7 shows a top view of the structure according to FIG. 3 before relamination. FIG. 8 shows a top view of another embodiment in which, around pad 110, multiple connection provisions are foreseen to gain local stress information. As can be taken from FIG. 7 and FIG. 8, the strain gauge 108 may for example comprise a meandrous electrically conductive path (compare FIG. 7) or a circumfering electrically conductive path (compare FIG. 8). According to FIG. 8, the strain gauge 108 is hence arranged to surround a pad 110 for which a strain behavior is under investigation. The strain gauges 108 may be configured as a planar structure located exclusively within one plane. According to FIG. 8, the strain gauge 108 comprises a plurality of separate sections each of which being configured for locally detecting strain exerted on a corresponding portion of the component carrier 100 at which the respective section is located.

Figure 9:
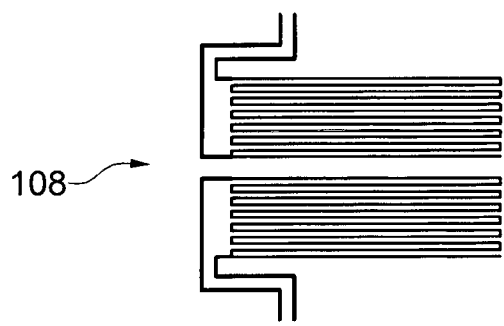
FIG. 9 shows a plan view of a meandrous strain gauge according to an exemplary embodiment of the invention.

FIG. 9 shows a plan view of a strain gauge 108 with a meandrous shape according to an exemplary embodiment of the invention.

Figure 10:
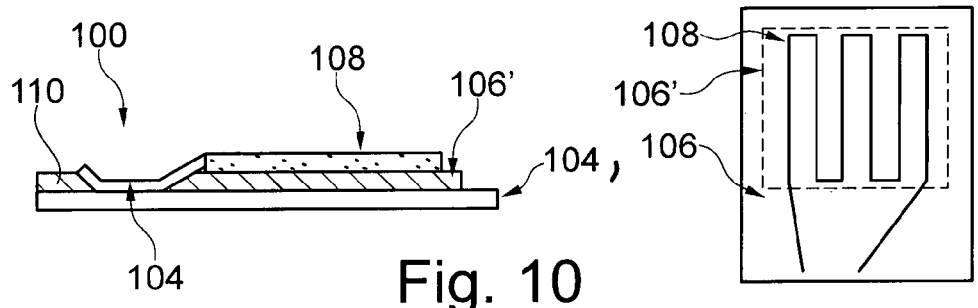
FIG. 10 shows a cross-sectional view of a component carrier with integrated strain gauge and a plan view of the strain gauge according to an exemplary embodiment of the invention.

FIG. 10 shows a cross-sectional view of a component carrier 100 with integrated strain gauge 108 and a plan view of the strain gauge 108 according to another exemplary embodiment of the invention. Readout may be made via a Wheatstone bridge. As an electrically conductive connection between the pad 110 and the strain gauge 108, an electrically conductive layer structure 104 is used according to FIG. 10.

Figure 11:
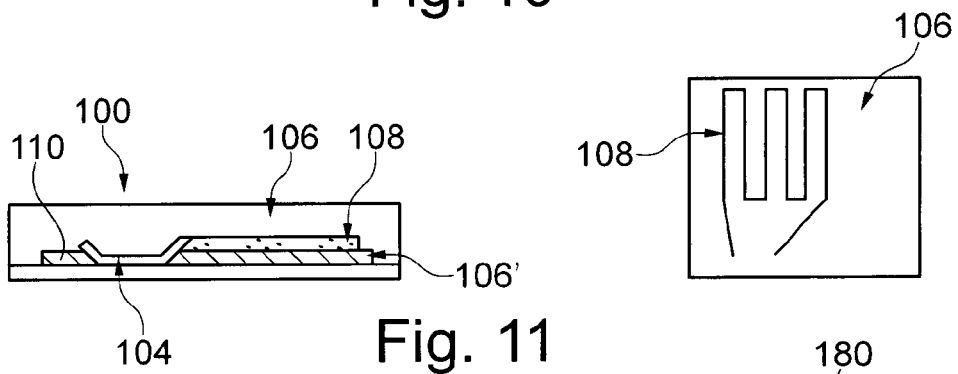
FIG. 11 shows a cross-sectional view of a component carrier with integrated strain gauge and a plan view of the strain gauge according to yet another exemplary embodiment of the invention.

FIG. 11 shows a cross-sectional view of a component carrier 100 with integrated strain gauge 108 and a plan view of the strain gauge 108 according to yet another exemplary embodiment of the invention. FIG. 11 shows the structure of FIG. 10 with a prepreg layer laminated on top as further electrically insulating layer structure 106.

Figure 12:
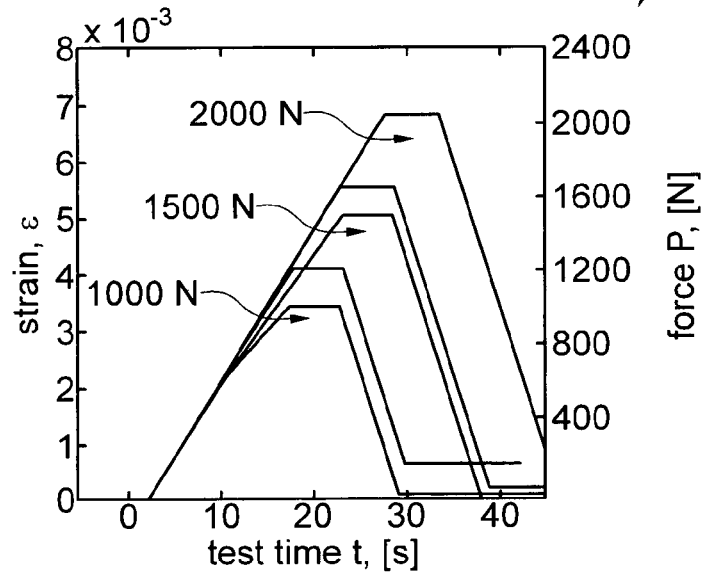
FIG. 12 shows a diagram indicative of a behavior of a strain gauge integrated in a component carrier in response to strain according to an exemplary embodiment of the invention.

FIG. 12 shows a diagram 180 indicative of a behavior of a strain gauge 108 integrally formed with a component carrier 100 in response to strain according to an exemplary embodiment of the invention.

The following test program has been carried out to obtain the diagram 180:

Loading until a defined force (1000 N, 1500 N and 2000 N tests were carried out) is applied (displacement controlled 1 mm/min)

Hold 5 s (displacement controlled)

Unloading to 0 N (force controlled 160 N/s)

The strain in the strain gauge measurement was calculated from the output voltage using a calibration factor.

For the 1500 N test, five repetitions were performed.

Figure 13:
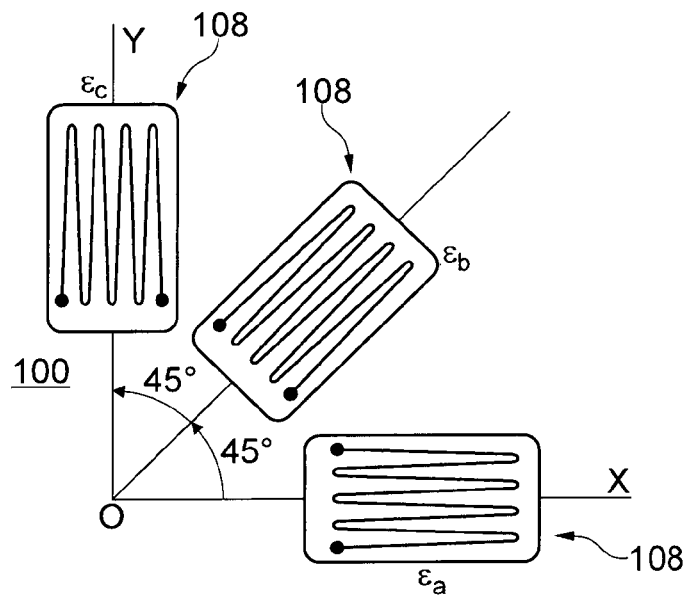
FIG. 13 and FIG. 14 show plan views of rosette-shaped strain gauges embedded in a component carrier according to exemplary embodiments of the invention.
Figure 14:
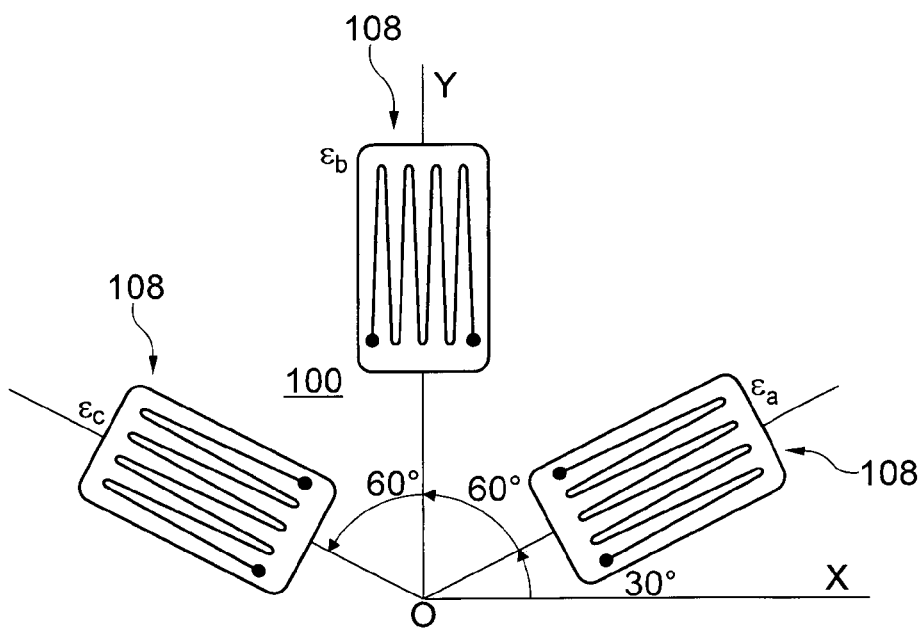

FIG. 13 and FIG. 14 show plan views of rosette-shaped strain gauges 108 embedded in a component carrier 100 according to exemplary embodiments of the invention. According to FIG. 13 and FIG. 14, the strain gauge 108 comprises a plurality (three in both cases) of separate sections being arranged as rosette. This allows the detection of a two-dimensional state of stress and/or principle stresses and principle strains exerted on a corresponding portion of the component carrier 100 at which the respective section is located. FIG. 13 relates to a 45° strain gauge rosette layout, whereas FIG. 14 relates to a 60° strain gauge rosette layout.

It should be noted that the term "comprising" does not exclude other elements or steps and the "a" or "an" does not exclude a plurality. Also elements described in association with different embodiments may be combined.

Implementation of the invention is not limited to the preferred embodiments shown in the figures and described above. Instead, a multiplicity of variants is possible which use the solutions shown and the principle according to the invention even in the case of fundamentally different embodiments.

The invention claimed is:

1. A method of manufacturing a component carrier for carrying an electronic component on and/or in the component carrier, wherein the method comprises:

forming an interconnected stack of a plurality of electrically conductive layer structures and a plurality of electrically insulating layer structures by a lamination procedure; and configuring at least part of at least one of the electrically conductive layer structures as at least part of an integrated strain gauge for detecting strain exerted on at least part of the component carrier;

wherein the integrated strain gauge is formed at least partially by laminating and patterning an electrically conductive layer, wherein the laminating and patterning of the electrically conductive layer of the integrated strain gauge is fully integrated in the lamination procedure of the interconnected stack;

wherein the at least one electrically conductive layer structure is partly configured as at least part of the integrated strain gauge such that the at least one electrically conductive layer structure includes a portion, which is used as or for the integrated strain gauge, and a remaining portion which is used for another purpose, and wherein a thickness of the portion of the electrically conductive layer structure, which is used as or for the integrated strain gauge, is selectively thinned, and the remaining portion of the electrically conductive layer structure remains thicker.

2. The method according to claim 1, wherein the integrated strain gauge is neither surface-mounted as a separate part on the interconnected stack nor embedded as a separate part within the interconnected stack.

3. The method according to claim 1, wherein the selectively thinning is made by differential etching.

* * * * *